(12) United States Patent
Nagulapalli

(10) Patent No.: US 12,531,557 B2
(45) Date of Patent: Jan. 20, 2026

(54) HIGH-EFFICIENCY HIGH-SWING VOLTAGE MODE LOGIC DRIVER SYSTEMS AND METHODS

(71) Applicant: ANALOG DEVICES, INC., Wilmington, MA (US)

(72) Inventor: Rajasekhar Nagulapalli, Wilmington, MA (US)

(73) Assignee: Analog Devices, Inc., Wilmington, MA (US)

(*) Notice: Subject to any disclaimer, the term of this patent is extended or adjusted under 35 U.S.C. 154(b) by 0 days.

(21) Appl. No.: 18/439,756

(22) Filed: Feb. 12, 2024

(65) Prior Publication Data

US 2024/0275377 A1    Aug. 15, 2024

Related U.S. Application Data

(60) Provisional application No. 63/445,032, filed on Feb. 13, 2023.

(51) Int. Cl.
| | | |
|---|---|---|
| H03K 17/30 | (2006.01) |
| H03F 3/45 | (2006.01) |
| H03K 19/00 | (2006.01) |
| H03K 19/0185 | (2006.01) |

(52) U.S. Cl.
CPC ....... *H03K 17/302* (2013.01); *H03F 3/45183* (2013.01); *H03F 3/45273* (2013.01); *H03K 19/0005* (2013.01); *H03K 19/018528* (2013.01); *H03F 2200/261* (2013.01)

(58) Field of Classification Search
CPC ............. H03K 17/302; H03K 19/0005; H03K 19/018528; H03K 19/018521; H03K 19/018557; H03K 19/018564; H03K 19/018571; H03K 19/018578; H03K 17/164; H03K 19/018507; H03K 19/0185; H03K 19/018514; H03F 3/45183; H03F 3/45273; H03F 2200/261; H03F 1/0211; H03F 3/3022; H03F 3/3061; H03F 3/45179; H03F 3/45076; H03F 3/45188; H03F 1/0205
See application file for complete search history.

(56) References Cited

U.S. PATENT DOCUMENTS 7,535,258 B1 *  5/2009  Johnson ................ H03F 3/4565
326/82

* cited by examiner

*Primary Examiner* — Jung Kim
(74) *Attorney, Agent, or Firm* — Schwegman Lundberg & Woessner, P.A.

(57) ABSTRACT

High-swing push-pull assisted Voltage Mode Logic (VML) driver circuits can enhance output voltage amplitude to improve efficiency and performance in electronic applications. For example, this is accomplished by utilizing a primary current generator circuit that is powered by a supply voltage to generate a primary current. The primary current is provided, through a switching circuit, to an output node that, in response to an input signal, generates a first output voltage. Further, a supplementary current generator circuit is coupled to the switching circuit to generate a secondary current. The combination of the primary and secondary currents increases the amplitude of the first output voltage, thereby enabling the VML driver circuit to deliver enhanced performance, particularly in applications requiring precise voltage control and high efficiency.

20 Claims, 8 Drawing Sheets

HIGH-EFFICIENCY HIGH-SWING VOLTAGE MODE LOGIC DRIVER SYSTEMS AND METHODS

CROSS REFERENCE TO RELATED PATENT APPLICATIONS

The present application claims priority benefit, under 35 U.S.C. § 119(e), to co-pending and commonly assigned U.S. Provisional Patent Application No. 63/445,032, filed on Feb. 13, 2023, entitled "HIGH-EFFICIENCY HIGH-SWING VOLTAGE MODE LOGIC DRIVER SYSTEMS AND METHODS," and listing as inventor Rajasekhar Nagulapalli, which application is herein incorporated by reference as to its entire content. Each reference mentioned in this patent document is incorporated by reference herein in its entirety.

BACKGROUND

A. Technical Field

The present disclosure relates generally to transmission circuits, including networking devices. More particularly, the present disclosure relates to systems and methods for efficient, high-swing push-pull assisted voltage mode logic (VML) drivers.

B. Background

Transmitter output line drivers play a key role in transmitter performance and power consumption. The two main driver architectures are the current mode logic (CML) driver and the voltage mode logic (VML) driver. CML drivers utilize a differential-pair design that utilizes a known bias current and switches current to the output load. Limitations of the prior art will be apparent to those skilled in the art. As an example, it is well-known that CLM driver circuits tend to suffer from low efficiency, whereas VML driver architectures suffer from signal integrity issues. Existing challenges are exacerbated by the continuing trend towards increasing speed and efficiency demands in transmitter design. Accordingly, what is needed are systems and methods that reduce power consumption in output line driver circuits, ideally, without scarifying signal integrity.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not to scale.

DETAILED DESCRIPTION OF EMBODIMENTS

Figure 1:
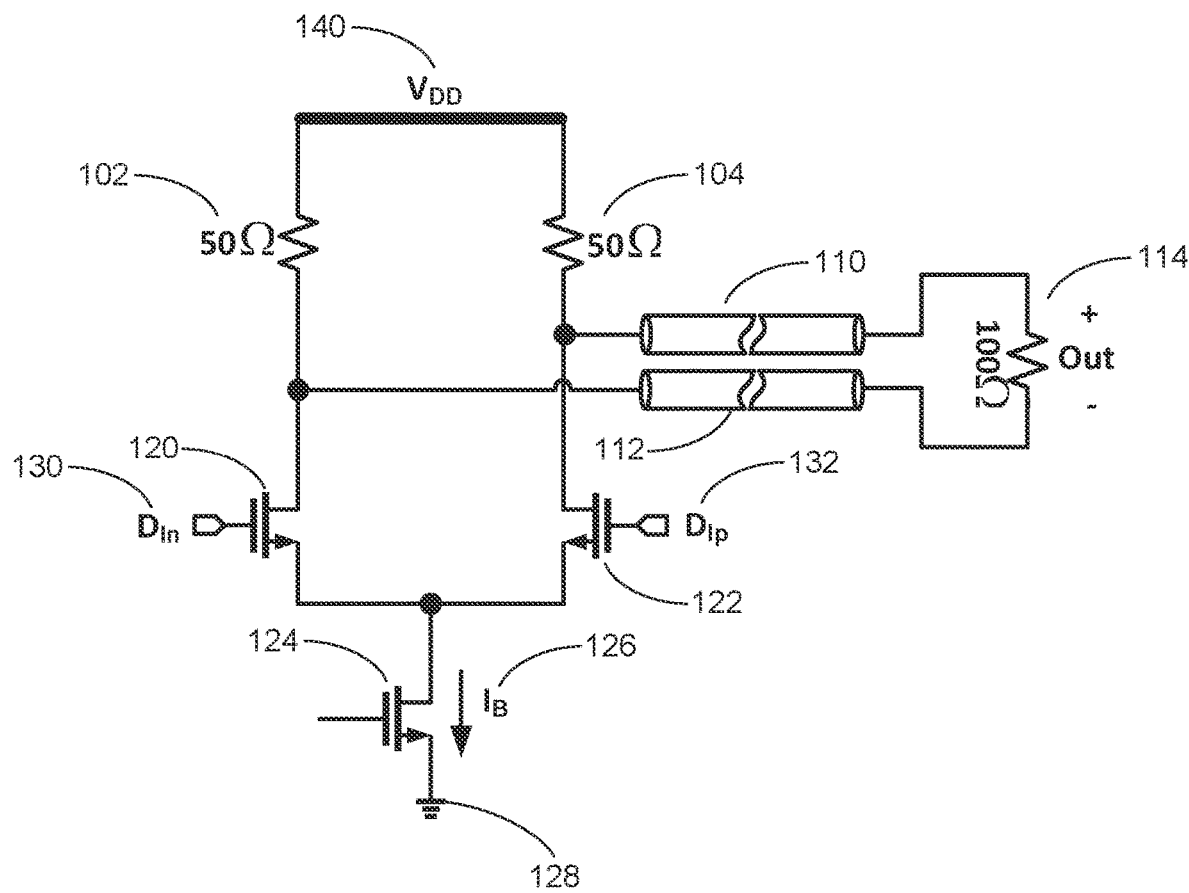
FIG. 1 depicts a conventional CML-type transmitter output line driver circuit implementation.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists that follow are examples and not meant to be limited to the listed items. Any headings used herein are for organizational purposes only and shall not be used to limit the scope of the description or the claims. Each reference mentioned in this patent document is incorporated by reference herein in its entirety.

Furthermore, it shall be noted that embodiments described herein are framed in the context of single-ended and differential VML transmitter drivers, but one skilled in the art shall recognize that the teachings of the present disclosure are not limited to VML transmitter applications and may equally be used in other contexts and may be combined with any designs known in the art to achieve the objectives of the present disclosure.

FIG. 1 depicts a conventional CML transmitter output line driver circuit design. As shown in FIG. 1, circuit 100 comprises termination resistors 102, 104, transmission lines 110, 112, load 114, transistors 120-124, differential inputs 130, 132, and power source 140. Bias current 126 flows to ground 128 through transistor 124. Transmission lines 110, 112 are typically implemented as copper wires having a predefined physical length corresponding to an electrical length that constitutes a compromise that takes into account the various frequencies of particular applications of circuit 100.

In operation, differential inputs 130, 132, denoted in FIG. 1 as $D_{IN}$ and $D_{IP}$, respectively, are complementary in that they act in opposite ways, i.e., when the status of $D_{IN}$ is high the status of $D_{IP}$ is low and vice versa. As a result, either transistor 120 or transistor 122 is turned on at any given time. Circuit 100 follows a current-steering principle, and its output swing can be expressed as:

$$V_{pk-pk} = 25 \cdot I_B \qquad \text{(Eqn. 1)}$$

As an example, a $V_{pk-pk}$ of 100 mV results in a bias current of 2 mA. As is known in the art, circuit 100 tends to suffer from low efficiency due to bias current 126 being divided between near-end and the far-end terminations. In contrast, VML driver architectures attempt to improve power efficiency by placing the near-end and far-end terminations in a series configuration such that the peak-to-peak differential swing of the output is equal to $V_{DD}$.

Figure 2:
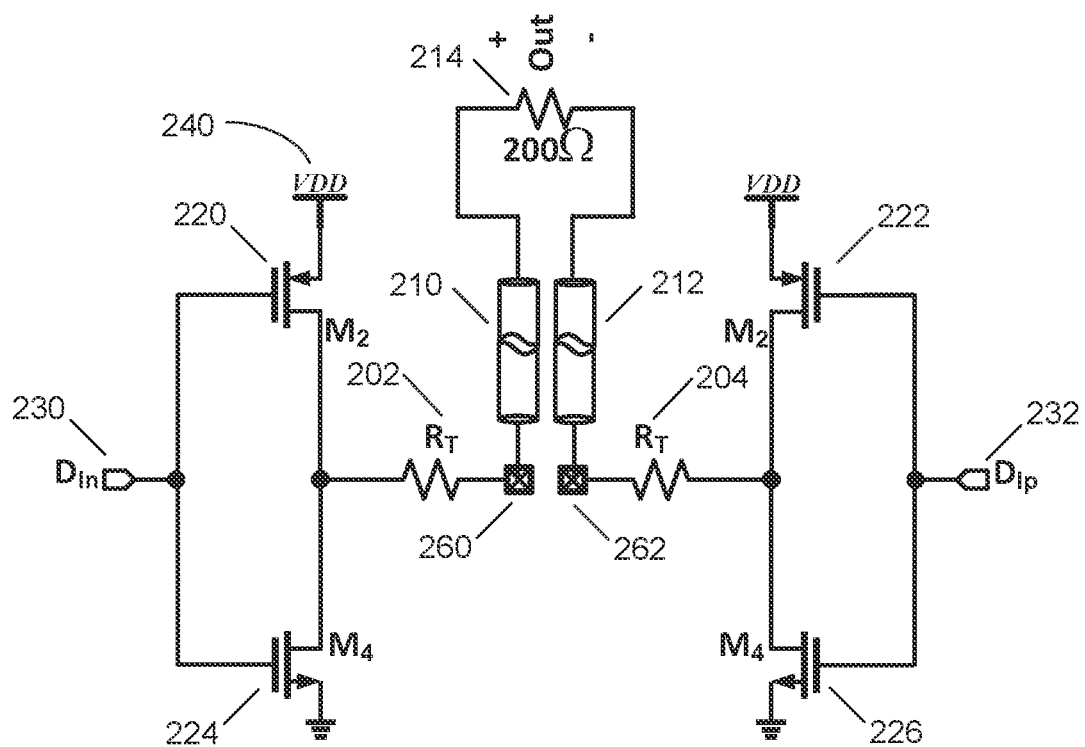
FIG. 2 depicts a conventional VML-type transmitter output line driver circuit implementation.

FIG. 2 depicts a conventional VML transmitter output line driver circuit design. Circuit 200 comprises termination resistors 202, 204, transmission lines 210, 212, load 214, transistors 220-226, differential inputs 230, 232, power source 240, and output nodes 260, 262. As depicted, each of transistors 220 or 222, when combined with a respective termination resistor 202, 204 (denoted as $R_T$ in FIG. 2) form a terminal resistance of 50Ω at respective output nodes 260, 262. Transistors 220 and 224 are typically sized such that each of the series configuration of terminal resistor 202 or 204 with any one of transistor 220 or 222 forms the required 50 Ω output resistance for circuit 200.

In operation, in a manner similar to the CML circuit in FIG. 1, when the status of input $D_{IN}$ 230 is high, the status of $D_{IP}$ is low. Transistor 222 is biased in the triode region, thus causing a current to flow from power supply 240 to the transmission channel through transistor 220 and resistor 202. The current further flows from the transmission channel, which comprises load 214, to ground via resistor 204 and transistor 226. For purposes of brevity the analogous considerations for the mirrored part of circuit 200 and its operation are not repeated herein. Therefore, at any given time, either transistors 220 and 226 are turned on or transistors 222 and 224 are turned on, providing respective current paths from power supply 240 to ground, i.e., from a source to a sink. Given that the total series resistance in that current path is practically 200Ω, the current can be expressed as follows:

$$I_B = V_{DD}/200 \qquad \text{(Eqn. 2)}$$

In practice, transistors 220 and 222 are typically trimmed to compensate for process, voltage, and temperature (PVT) variations to reduce unwanted reflections of signals caused by imperfect impedance matching between, e.g., resistor 202 and transmission line 210. Overall, for a given swing, VML architecture 200 draws about 75% less current from power supply 240 when compared to a typical CML driver, such as that shown in FIG. 1.

Despite its popularity due to its high power-efficiency, the maximum swing that VML driver 200 can generate, as indicated in Eqn. 3, is limited by supply voltage 240 and is relatively small compared to that of a CML driver.

$$V_{SW\_CML} = 2 \cdot (V_{DD} - 2 \cdot V_{ov}) \qquad \text{(Eqn. 3)}$$

It is noted that circuit 200 comprises no variable current sources that would allow for adjustments in the transmitter output. It is further noted that the superior efficiency of the VML driver design comes at the expense of signal integrity. Due to mainly the increased number of transistors and their inherent parasitic input capacitances, the VML driver architecture thus cannot match the signal integrity of comparable CML drivers. Therefore, it is desirable to have power efficient systems and methods that can increase the output swing without negatively affecting signal integrity.

Figure 3:
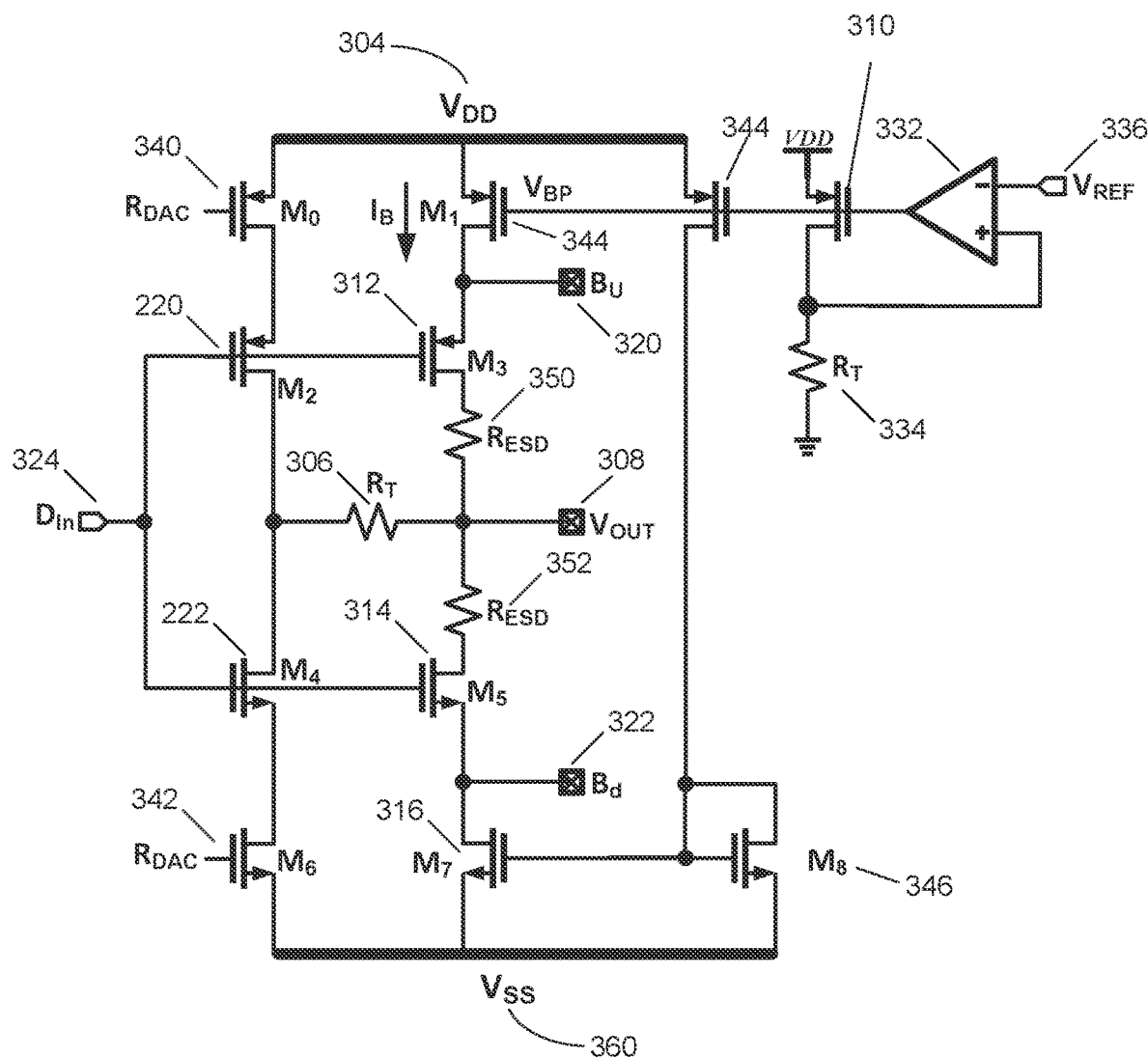
FIG. 3 illustrates and exemplary push-pull-assisted VML driver slice according to various embodiments of the present disclosure.

FIG. 3 illustrates and exemplary push-pull-assisted VML driver slice according to various embodiments of the present disclosure. In embodiments, VML driver slice 300 comprises power supply 304, electrostatic discharge (ESD) resistors 350, 352, termination resistors 306 and 334, differential input 324, transistors 220, 222, 310-316, and 340-346, output pad 308, upswing and downswing nodes 320 and 322, respectively, operational amplifier 332, reference node 336, and output node 308. Differential input 324 may be coupled to any type of circuit, such as a control circuit, buffer, microcontroller, etc., that can provide a digital logic signal.

In embodiments, termination resistors 306 and 334 may be implemented as 50Ω resistors, whereas ESD resistors 350, 352 may be implemented as having a resistance value greater (e.g., 1Ω than resistors 306 and 334. As a person skilled in the art familiar with transmission line theory will appreciate, using resistors to limit current flowing through transistors 312 and 314 in this manner increases the impedance of the current path that comprises parasitic capacitances and, advantageously, reduces unwanted potential reflected waves, which, in embodiments, aids in maintaining signal integrity at acceptable levels. In embodiments, VML driver slice 300 may be mirrored and used in a VML driver such as that shown in FIG. 4.

In operation, the reference voltage $V_{REF}$ at reference node 336 may be chosen, e.g., $V_{DD}/2$, to cause operational amplifier 332 to control the gate voltage of transistor 344 such as to act as a current source that provides to termination resistance 306 an additional current $I_B$ that increases the voltage swing at output node 308 by an amount substantially equal to the additional current multiplied be termination resistance 306, i.e., $I_B \cdot R_T$.

Further, in embodiments, since the drains of transistors 312 and 314 would otherwise be directly connected to output pad 308, thereby, leaving transistors 312 and 314 exposed, which may compromise performance of circuit 300, e.g., due to accidental charged device model electrostatic discharge events, respective ESD resistors 350 and 352 may be used to protect the output stage of circuit 300 against events that may potentially cause irreversible damage to VML slice 300.

Transistors 220, 222 form the VML driver devices for the datapath, and transistors 340 and 342 may be viewed as forming an RDAC-element that, in embodiments, may be controlled such as to adjust the output impedance of VML driver slice 300 to the desired 50Ω termination impedance, irrespective of PVT variations. As an example, assuming that the output impedance of circuit 300 is 46Ω, in embodiments, to achieve a desired 50Ω termination resistance, transistors 340 and 342 may be adjusted in a way such as to provide an additional 4Ω of resistance each. In embodiments, this may be accomplished by controlling the gate voltage of transistors 340 and 342 by any means known in the art, for example, by using a DAC controller. However, this is not intended to limit the scope of the present disclosure since, for example, variable resistors and other circuit elements and combinations thereof may equally be employed to adjust the impedance of the datapath to create a desired output impedance for any number of operating frequencies, etc.

It is noted that driver VML slice 300 illustrated in FIG. 3 is not limited to the constructional detail shown there or described in the accompanying text. As those skilled in the art will appreciate, a suitable driver circuit may comprise additional and/or different variable resistors, switching elements, current sources, control logic, and auxiliary devices, which may be combined in various configurations to achieve the objectives of the present disclosure.

Figure 4:
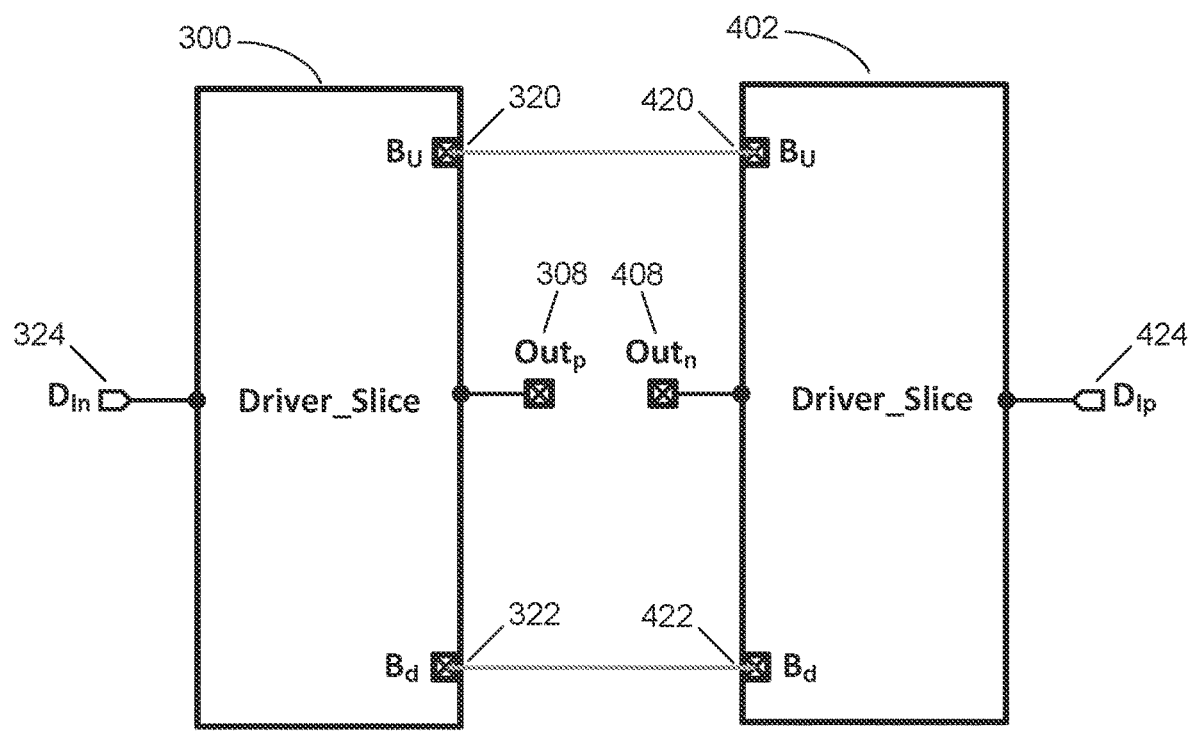
FIG. 4 illustrates an exemplary slicer implementation in a driver circuit according to various embodiments of the present disclosure.

FIG. 4 illustrates a simplified schematic of a slicer implementation in an exemplary driver circuit according to various embodiments of the present disclosure. Same numerals as in FIG. 3 denote similar elements. In embodiments, driver circuit 400 in FIG. 4 may comprise VML driver slices 300, 402, differential inputs 324, 424, upswing nodes 320, 420, downswing nodes 322, 422, output pads 308 and 408.

As shown in FIG. 4, circuit 400 comprises VML driver slices 300 and 402, whose combination form a VML driver. Upswing nodes 320, 420 and downswing nodes 322, 422 are coupled to each other to enable current steering between the two slices. The overall swing of the proposed driver can be expressed $$V_{SW} = V_{DD} + I_B \cdot R_T \quad \text{(Eqn. 4)}$$

It is noted that circuit 400 may be implemented on one or more printed circuit boards and may be designed to have any arbitrary termination resistance, e.g., to match a specific load impedance.

Figure 5:
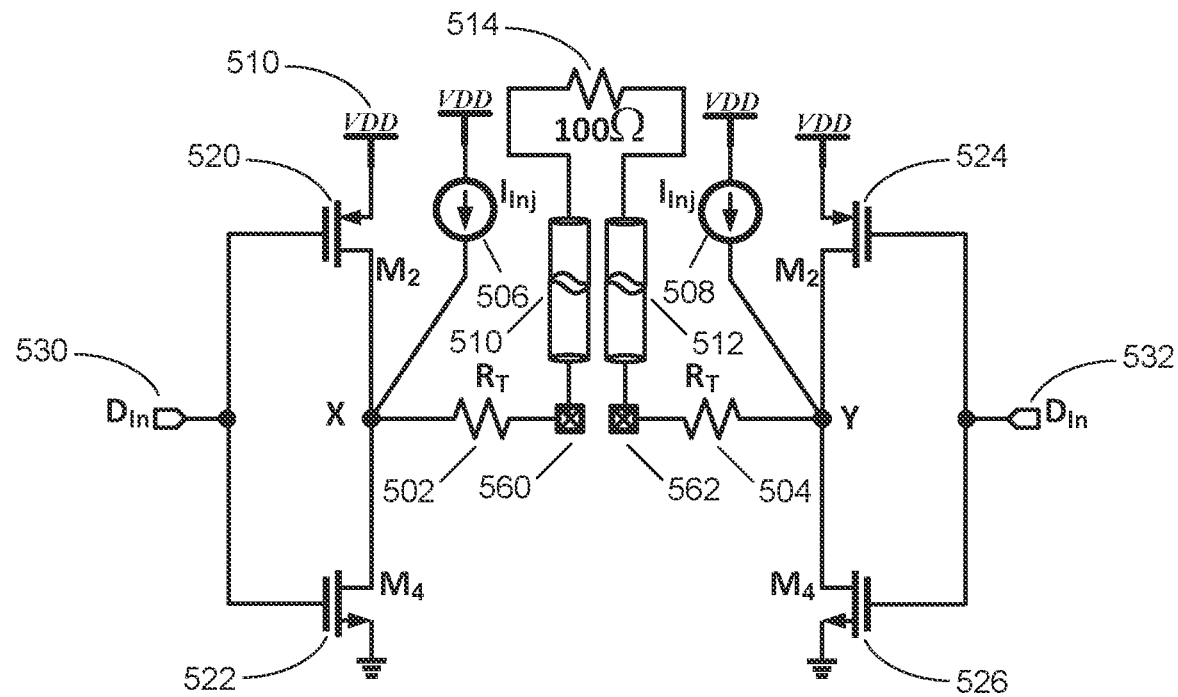
FIG. 5 illustrates a simplified schematic of a VML transmitter output line driver circuit design according to various embodiments of the present disclosure.

FIG. 5 illustrates a simplified schematic of a VML transmitter driver according to various embodiments of the present disclosure. For clarity, components similar to those shown in FIG. 2 are labeled in the same manner. For purposes of brevity, a description or their function is not repeated here.

VML transmitter driver 500 in FIG. 5 comprises power supply 510, termination resistors 502, 504, differential inputs 520, 532, current sources 506, 508, transistors 520-526, output pads 560, 562, and load 514. It is understood that due to the differential nature of circuit 500, the left-hand side is replicated and mirrored on the right-hand side.

In operation, instead of utilizing transistors to provide an additional constant current to termination resistance 502 as mentioned with reference to FIG. 3, in embodiments, current source 506 may be used to directly inject a boost current to termination resistance 502, the injected boost current thereby being imposed onto, i.e., combined with, current otherwise induced to flow through termination resistance 502 by operation of transistors 520, 522. Termination resistance 502 is denoted as node "X" in FIG. 5. Advantageously, this injected boost current makes the swing independent of power supply 510.

Figure 6:
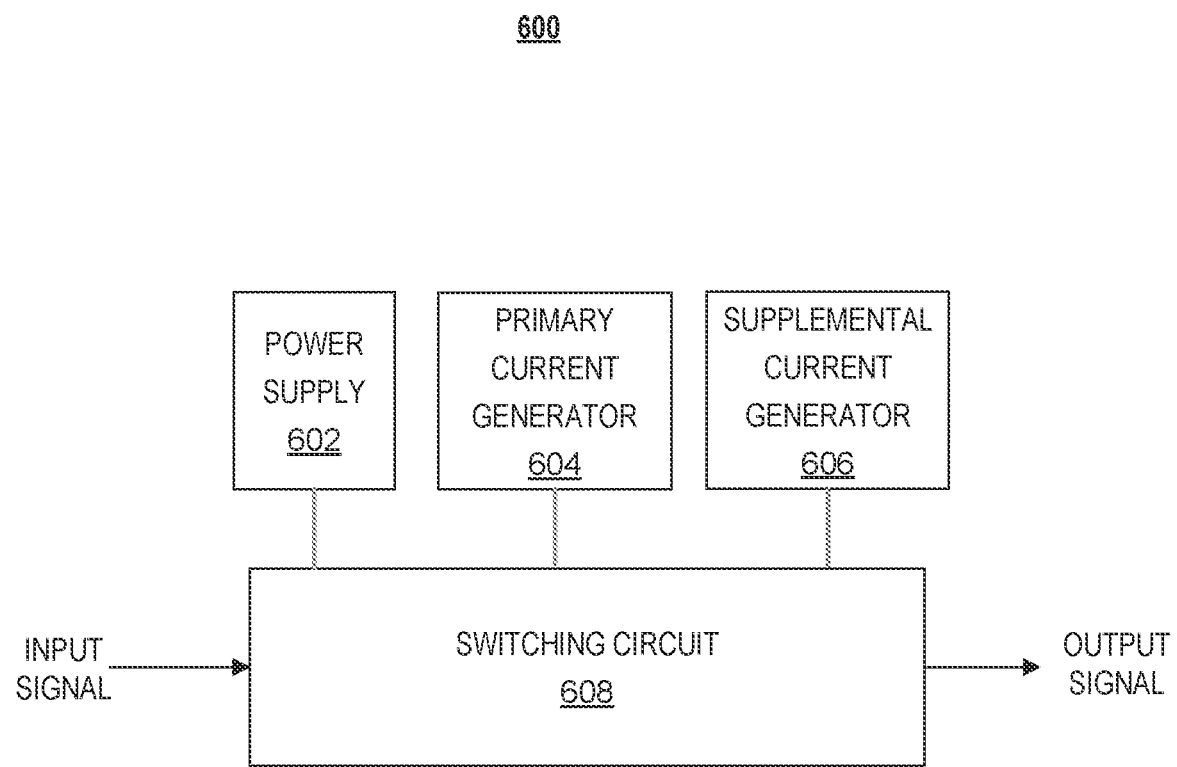
FIG. 6 is a simplified system diagram for a VML transmitter output line driver circuit design according to various embodiments of the present disclosure.

FIG. 6 is a simplified system diagram for a VML transmitter driver according to various embodiments of the present disclosure. In embodiments, driver system 600 comprises power source 602, primary current generator 604, supplemental current generator 606, and switching circuit 608. Power source 602 may comprise any number of gain stages to provide power to an output stage of a transmitter.

In operation, driver system 600 receives a digital input signal, e.g., a positive and negative logic signal and generates an output signal that drives a load (not shown in FIG. 6). In embodiments, to take advantage of an improved output swing provided by a sub-circuit such as the VML driver slice 300 shown in FIG. 3, primary current generator 604 uses switching circuit 608 to drive a current through an output resistor that acts as an internal resistance of driver system 600 to generate an output signal that drives a load (also not shown). In embodiments, the output signal may be modified by supplemental current generator 606 that generates a current that is injected at a voltage node that is coupled to the output resistor such as to enhance, e.g., a voltage amplitude of the output signal.

Figure 7:
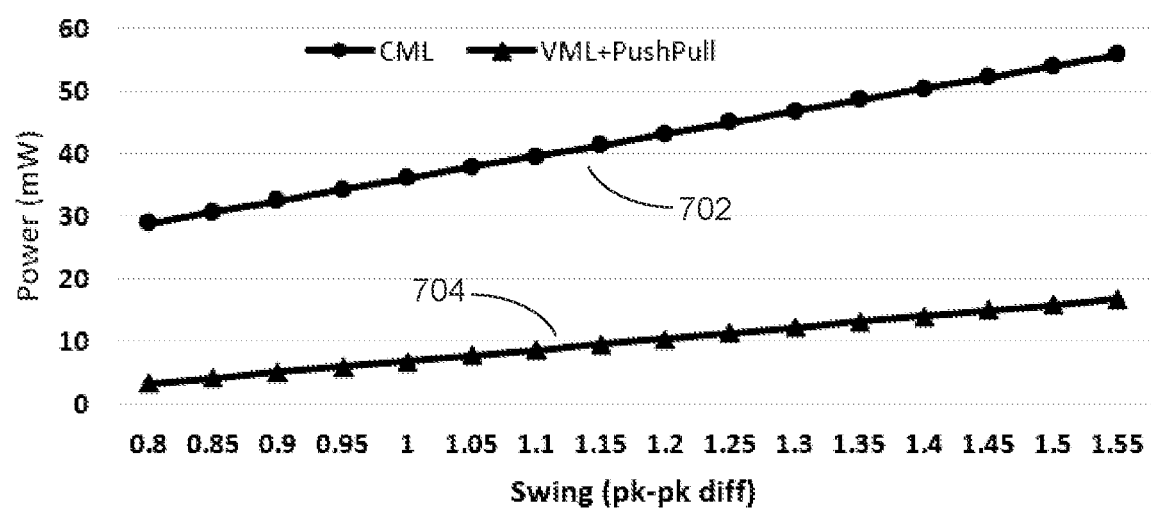
FIG. 7 is a comparison of simulation results between a conventional CML driver and a VML driver according to various embodiments of the present disclosure.

FIG. 7 is a comparison of simulation results between a conventional CML driver and a VML driver according to various embodiments of the present disclosure. Plot 702 illustrates the power consumption for a given swing for a conventional CML driver. Conversely, plot 704 illustrates the power consumption for a given swing for a VML driver according to various embodiments herein. The experimental results in FIG. 7 confirm that the present embodiments consume less power when compared to conventional CML drivers. At the same time, these embodiments also achieve a relatively much higher swing when compared to conventional VML drivers, as previously mentioned.

It shall be noted that these experiments and results are provided by way of illustration and were performed under specific conditions using a specific embodiment or embodiments; accordingly, neither these experiments nor their results shall be used to limit the scope of the disclosure of the current patent document.

Figure 8:
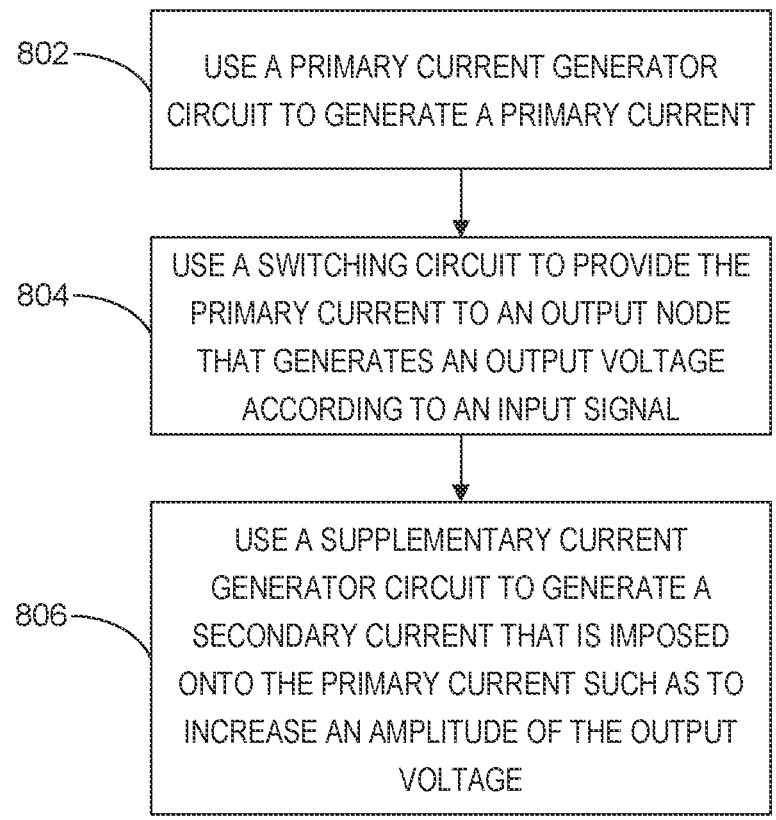
FIG. 8 is a flowchart for a process that increases voltage swing in a VML transmitter output line driver circuit in accordance with various embodiments of the present disclosure.

FIG. 8 is a flowchart for a process that enhances a voltage swing in a VML transmitter driver in accordance with various embodiments of the present disclosure. In embodiments, process 800 may begin at step 802 when a primary current generator circuit is used to generate a primary current in a circuit that receives a digital input signal, e.g., a differential input signal. The primary current may be provided to a termination resistor that is coupled within a switching circuit.

At step 804, the switching circuit may be used to provide the primary current to an output node, e.g., via the termination resistor. The output node outputs a voltage according to the digital input signal.

At step 806, a supplementary current generator circuit may be used to generate a secondary current that is imposed onto the primary current such as to increase an amplitude of the voltage swing at the output node and, thus, an operating voltage of the VML transmitter driver.

One skilled in the art will recognize that: (1) certain steps may optionally be performed; (2) steps may not be limited to the specific order set forth herein; (3) certain steps may be performed in different orders; and (4) certain steps may be done concurrently.

One skilled in the art will further recognize that no computing system or programming language is critical to the practice of the present invention. It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A push-pull assisted voltage mode logic (VML) driver circuit comprising:
    an input to receive an input signal;
    a primary current generator circuit configured to use a supply voltage to generate a primary current;
    a switching circuit coupled to the primary current generator circuit, the switching circuit configured to provide the primary current to an output node including a termination resistance, the output node configured to generate a first output voltage according to the input signal; and
    a supplementary current generator circuit coupled to the switching circuit, the supplementary current generator circuit comprising an operational amplifier circuit configured to generate a secondary current to the termination resistance, wherein the switching circuit is further configured to combine the secondary current with the primary current to increase an amplitude of the first output voltage by an amount substantially equal to the secondary current multiplied by the termination resistance.

2. The VML driver circuit according to claim 1, wherein the switching circuit is configured to use the secondary current to generate a second output voltage having a polarity opposite to that of the first output voltage.

3. The VML driver circuit according to claim 1, wherein the VML driver circuit is implemented in a transmitter that is coupled to a transmission line.

4. The VML driver circuit according to claim 3, wherein the transmission line is configured to drive a load with an impedance that varies with an operating frequency of the VML driver circuit.

5. The VML driver circuit according to claim 1, wherein the switching circuit comprises a set of CMOS circuit elements and the operational amplifier circuit comprises an input configured to receive a reference voltage.

6. The VML driver circuit according to claim 1, wherein the input is a differential input configured to receive a differential input signal.

7. The VML driver circuit according to claim 1, wherein the output node is coupled to an output resistor configured to act as an internal resistance resistor of the VML driver circuit.

8. The VML driver circuit according to claim 7, wherein the output resistor is implemented as a termination resistor to reduce unwanted reflections.

9. The VML driver circuit according to claim 1, wherein the output node is coupled to at least one electrostatic discharge resistor configured to protect the VML driver circuit against electrostatic discharge events.

10. A method for increasing voltage swing, the method comprising:
    generating a primary current by using a primary current generator circuit of a push-pull assisted voltage mode logic (VML) driver circuit, wherein the primary current generator circuit uses a supply voltage;
    providing the primary current to an output node via a switching circuit coupled to the primary current generator circuit, wherein the output node generates a first output voltage in response to an input signal and includes a termination resistance; and
    using a supplementary current generator circuit coupled to the primary current generator circuit and comprising an operational amplifier circuit to generate a secondary current to the termination resistance, wherein the switching circuit combines the primary current with the secondary current to increase an amplitude of the first output voltage by an amount substantially equal to the secondary current multiplied by the termination resistance.

11. The method according to claim 10, further comprising using the secondary current to generate a second output voltage that has a polarity opposite to that of the first output voltage.

12. The method according to claim 10, wherein the primary current generator circuit and the supplementary current generator circuit are implemented in a transmitter that is coupled to a transmission line.

13. The method according to claim 12, further comprising using the transmission line to drive a load with an impedance that varies with frequency.

14. The method according to claim 10, wherein the switching circuit comprises a set of CMOS circuit elements and the operational amplifier circuit comprises an input, the method further comprising receiving a reference voltage at the input.

15. The method according to claim 14, further comprising using the reference voltage to control the operational amplifier circuit.

16. The method according to claim 14, further comprising receiving a differential input signal at the input.

17. The method according to claim 16, wherein the differential input signal is a digital input signal.

18. The method according to claim 10, further comprising coupling the output node to an output resistor that acts as an internal resistance.

19. The method according to claim 18, wherein the output resistor is implemented as a termination resistor to reduce unwanted reflections.

20. The method according to claim 10, further comprising coupling the output node to at least one electrostatic discharge resistor that protects against electrostatic discharge events.

* * * * *